US011932792B2

(12) United States Patent
Takeda et al.

(10) Patent No.: US 11,932,792 B2
(45) Date of Patent: Mar. 19, 2024

(54) RED FLUORESCENT BODY AND LIGHT-EMITTING DEVICE

(71) Applicant: DENKA COMPANY LIMITED, Tokyo (JP)

(72) Inventors: Yusuke Takeda, Fukuoka (JP); Tomohiro Nomiyama, Fukuoka (JP); Marina Takamura, Fukuoka (JP); Shintaro Watanabe, Fukuoka (JP)

(73) Assignee: DENKA COMPANY LIMITED, Tokyo (JP)

( * ) Notice: Subject to any disclaimer, the term of this patent is extended or adjusted under 35 U.S.C. 154(b) by 767 days.

(21) Appl. No.: 17/042,477

(22) PCT Filed: Mar. 19, 2019

(86) PCT No.: PCT/JP2019/011621
§ 371 (c)(1),
(2) Date: Sep. 28, 2020

(87) PCT Pub. No.: WO2019/188632
PCT Pub. Date: Oct. 3, 2019

(65) Prior Publication Data

US 2021/0009896 A1 Jan. 14, 2021

(30) Foreign Application Priority Data

Mar. 29, 2018 (JP) ................................. 2018-064664

(51) Int. Cl.
*C09K 11/77* (2006.01)
*C01B 21/06* (2006.01)
*C09K 11/08* (2006.01)
*H01L 33/50* (2010.01)

(52) U.S. Cl.
CPC .... *C09K 11/77348* (2021.01); *C01B 21/0602* (2013.01); *C09K 11/0883* (2013.01); *H01L 33/502* (2013.01); *C01P 2006/11* (2013.01)

(58) Field of Classification Search
CPC ........... C09K 11/77348; C09K 11/0883; C01P 2006/11; C01B 21/0602; H01L 33/502
See application file for complete search history.

(56) References Cited

U.S. PATENT DOCUMENTS

| | | | |
|---|---|---|---|
| 2004/0155225 A1 | 8/2004 | Yamada et al. |
| 2007/0007494 A1 | 1/2007 | Hirosaki et al. |
| 2011/0305005 A1 | 12/2011 | Tsukatani et al. |
| 2015/0035430 A1 | 2/2015 | Yoshida et al. |
| 2017/0058197 A1 | 3/2017 | Nishimata et al. |
| 2017/0088772 A1 | 3/2017 | Yoshida et al. |
| 2017/0166810 A1 | 6/2017 | Morikawa et al. |
| 2018/0194999 A1 | 7/2018 | Nishimata et al. |
| 2020/0095501 A1 | 3/2020 | Ichikawa et al. |

FOREIGN PATENT DOCUMENTS

| | | | |
|---|---|---|---|
| JP | H08-339761 A | 12/1996 |
| JP | 2004-71726 A | 3/2004 |
| JP | 2004-238505 A | 8/2004 |
| JP | 2006-269938 A | 10/2006 |
| JP | 2013-127076 A | 6/2013 |
| JP | 2016-191057 A | 11/2016 |
| JP | 2017-110206 A | 6/2017 |
| JP | 2017-210626 A | 11/2017 |
| JP | 6273394 B1 | 1/2018 |
| WO | 2005/052087 A1 | 6/2005 |
| WO | 2012/046288 A1 | 4/2012 |
| WO | 2015/002139 A1 | 1/2015 |
| WO | WO 2018/092696 * | 5/2018 |

OTHER PUBLICATIONS

Sep. 29, 2020 International Preliminary Report on Patentability issued in International Patent Application No. PCT/JP2019/011621.
May 7, 2019 International Search Report issued in International Patent Application No. PCT/JP2019/011621.

* cited by examiner

*Primary Examiner* — C Melissa Koslow
(74) *Attorney, Agent, or Firm* — Oliff PLC

(57) ABSTRACT

A red phosphor represented by general formula: $MSiAlN_3$, wherein M is at least one or more elements selected from Mg, Ca, Sr and Ba, and is partially replaced with Eu and has, as a host crystal, a crystal structure identical to that of a $CaAlSiN_3$ crystal phase, and the phosphor has a bulk density of 0.70 $g/cm^3$ or more and 2.30 $g/cm^3$ or less. There is also provided a light-emitting element including the red phosphor and a semiconductor light-emitting element capable of exciting the red phosphor.

8 Claims, No Drawings

RED FLUORESCENT BODY AND LIGHT-EMITTING DEVICE

TECHNICAL FIELD

The invention relates to a red phosphor for a LED (Light Emitting Diode) or a LD (Laser Diode), and a light-emitting apparatus using the red phosphor.

BACKGROUND ART

White LEDs are devices that emit pseudo-white light by combinations of semiconductor light-emitting elements and phosphors, and combinations of blue LEDs and YAG yellow phosphors are known as typical examples. However, the white LEDs of such systems, while are categorized to those in white regions in terms of the chromaticity coordinate values, are insufficient in red light-emitting components and thus low in color rendition ability in an application of illumination, and image display apparatuses such as liquid crystal backlights have the problem of inferior color reproducibility. There is then proposed a combination use of a YAG phosphor with a nitride or oxynitride phosphor that emits red light, in order to supplement such an insufficient red light-emitting component (Patent Literature 1).

As a nitride phosphor that emits red light, there is known a phosphor including an inorganic compound having a crystal structure identical to that of $CaAlSiN_3$ (also commonly described as "CASN"), as a host crystal, which is activated with an optically active element such as $Eu^{2+}$. Patent Literature 2 describes the following: a phosphor (namely, a CASN phosphor activated with Eu) obtained by activating a host crystal of CASN with $Eu^{2+}$ emits light at a high brightness. Such a CASN phosphor is demanded to be much more enhanced in brightness when used for a white LED, because the emission color thereof includes many spectral components at longer wavelengths in the red region to thereby enable the high and depth color rendition ability to be realized, but includes also many spectral components low in luminosity factor.

Furthermore, Patent Literature 2 describes the following: there is obtained a phosphor (namely, a SCASN phosphor activated with Eu) in which a host crystal (also commonly described as "SCASN") also designated as $(Sr,Ca)AlSiN_3$, where Ca of the $CaAlSiN_3$ is partially replaced additionally with Sr, is activated with $Eu^{2+}$.

It is also disclosed that the crystal lattice of a SCASN phosphor can be controlled in a specified range to thereby narrow an emission spectrum and a high-brightness red phosphor is obtained (Patent Literature 3).

CITATION LIST

Patent Literature

Patent Literature 1: Japanese Patent Laid-Open No. 2004-071726

Patent Literature 2: International Publication No. WO2005/052087

Patent Literature 3: International Publication No. WO2015/002139

SUMMARY OF INVENTION

Technical Problem

Light-emitting apparatuses such as backlight and illumination for liquid crystal displays are always demanded to be improved in light-emitting characteristics, thus each member thereof is required to be enhanced in characteristics, and phosphors for use in LEDs are also demanded to be improved in light-emitting characteristics. There is also a demand for an improvement in yield of LED products by not only improvements in light-emitting characteristics by themselves, but also, for example, an improvement in production accuracy such that variations in light-emitting characteristics of white LEDs for individual products are reduced.

Solution to Problem

An object of the invention is to provide a red phosphor which can allow a light-emitting element such as a white LED to be more stably produced, which can allow the variation among LED products particularly with respect to chromaticity (herein, also simply referred to as "variation in chromaticity") to be suppressed, and which is typified by a CASN phosphor or a SCASN phosphor, in which such a red phosphor (hereinafter, also herein designated as "the red phosphor") is represented by general formula: $MSiAlN_3$ (wherein M is at least one or more elements selected from Mg, Ca, Sr and Ba), includes M partially replaced with Eu and has, as a host crystal, a crystal structure identical to that of a $CaAlSiN_3$ crystal phase. The inventors have made intensive studies for solving the above problems, and as a result, have found that a light-emitting element, for example, a white LED, more suppressed in variation in chromaticity, can be stably produced by controlling the bulk density of the red phosphor in a specified range.

That is, embodiments of the invention can provide the following aspects.

(1) A red phosphor represented by general formula: $MSiAlN_3$, wherein M is at least one or more elements selected from Mg, Ca, Sr and Ba, wherein the phosphor includes M partially replaced with Eu and having, as a host crystal, a crystal structure identical to that of a $CaAlSiN_3$ crystal phase, wherein the phosphor has a bulk density of 0.70 g/cm$^3$ or more and 2.30 g/cm$^3$ or less.

(2) The red phosphor according to (1), having an angle of repose of 60° or less.

(3) The red phosphor according to (1) or (2), wherein M is Ca, and the phosphor has a bulk density of 0.70 g/cm$^3$ or more and 1.80 g/cm$^3$ or less.

(4) The red phosphor according to (1) or (2), wherein M is Ca or Sr, and the phosphor has a bulk density of 1.20 g/cm$^3$ or more and 2.30 g/cm$^3$ or less.

(5) The red phosphor according to any one of (1) to (4), having an angle of repose of 20° or more.

(6) The red phosphor according to any one of (1) to (5), having an angle of repose of 45° or less.

(7) A light-emitting element including the red phosphor according to any one of (1) to (6), and a semiconductor light-emitting element capable of exciting the red phosphor.

(8) A light-emitting apparatus including the light-emitting element according to (7).

Advantageous Effects of Invention

The red phosphor which can be provided according to an embodiment of the invention, having a bulk density in a specified range, can be combined with a semiconductor light-emitting element capable of exciting the phosphor, thereby forming a light-emitting element, and can allow, for example, a light-emitting element suppressed in variations in light-emitting characteristics typified by chromaticity of a white LED and more stabilized in light-emitting characteristics to be provided. Furthermore, an embodiment of the invention can provide a light-emitting apparatus including the light-emitting element and an instrument receiving the light-emitting element. Examples of the light-emitting apparatus include an illumination apparatus, a backlight apparatus, an image display apparatus and a signal apparatus.

DESCRIPTION OF EMBODIMENT

Hereinafter, modes for carrying out the invention will be described in detail. Any numerical value range herein includes the upper limit value and the lower limit value thereof, unless particularly noted.

The phosphor of the invention is represented by general formula: $MSiAlN_3$ (wherein M is at least one or more elements selected from Mg, Ca, Sr and Ba), and M may preferably includes Ca and/or Sr. Preferably, M may be Ca alone or correspond to Sr and Ca which are proportioned as M such that the ratio in the number of moles between Sr and Ca satisfies Sr/(Ca+Sr)=0.35 or more and 0.95 or less. The ratio in the number of moles between Sr and Ca further preferably satisfies Sr/(Ca+Sr)=0.40 or more and 0.90 or less.

The main crystal phase of the red phosphor has a structure identical to that of a $CaAlSiN_3$ crystal phase. Whether or not the main crystal phase of the phosphor has a structure identical to that of a $CaAlSiN_3$ crystal phase can be confirmed by powder X-ray diffraction. A case where the crystal structure is different from that of $CaAlSiN_3$ is not preferable because the color of light emission is not a red color or the intensity of fluorescence is significantly reduced. The crystal phase is preferably such a single crystal phase, and may include a different phase as long as characteristics of the phosphor are not largely affected.

The backbone structure of a $CaAlSiN_3$ crystal or a (Sr, Ca)$AlSiN_3$ crystal is any structure which is formed by binding of (Si,Al)—N4 regular tetrahedron and in which a Ca atom and a Sr atom are positioned in the gap. $Ca^{2+}$ and $Sr^{2+}$ are partially replaced with $Eu^{2+}$ serving as a light emission center, thereby providing a red phosphor.

The content rate of Eu as an activation element of the phosphor of the invention is preferably 0.01% by atom or more and 1.0% by atom or less, particularly preferably 0.03% by atom or more and 0.5% by atom or less because a too low content rate tends to cause such an element to less contribute to light emission and a too high content rate tends to cause concentration quenching of the phosphor due to energy transfer of $Eu^{2+}$ to occur.

The red phosphor includes a trace amount of oxygen (O) as an inevitable component. The share of an M element, the Si/Al ratio, the N/O ratio, and the like are adjusted such that not only the crystal structure is maintained, but also electroneutrality as a whole is kept.

The red phosphor preferably has a bulk density of 0.70 $g/cm^3$ or more and 2.30 $g/cm^3$ or less. A bulk density of less than 0.70 $g/cm^3$ or more than 2.30 $g/cm^3$ causes an increase in variation in chromaticity of any LED made by use of the phosphor.

In general, the bulk density of a powder can be determined according to a method involving measuring the volume of a known weight of a powder sample loaded in a measuring cylinder (method 1), a method involving measuring the mass of a known volume of a powder sample loaded in a container, through a volumeter (method 2), or a method of measurement by use of a dedicated container for measurement (method 3). In particular, the method 1 and the method 3 are desirably used. Hereinafter, the method 3 will be described in detail. First, a sample is provided in an amount sufficient for measurement. A dry cylindrical container for measurement, having a constant volume, is equipped with an auxiliary cylinder, and a required amount of the sample is loaded therein. Such a container for measurement, equipped with an auxiliary cylinder, is tapped several times at 50 to 60 times/min. The auxiliary cylinder is removed, an excess powder is scraped off from the upper surface of the container, and the weight is measured. The mass of an empty cylindrical container, measured in advance, is subtracted, and thus the mass of the resulting powder is measured. The weight per unit volume of the sample is calculated, and thus the bulk density is determined. The bulk density is preferably repeatedly measured, more preferably measured multiple times and determined as the average value of such measurement values.

The bulk density of a powder can be generally controlled by the grain size, the grain size distribution and the surface state of the powder.

The red phosphor preferably has a mass median size (D50) of 30 μm or less, as measured according to a laser diffraction scattering method. A mass median size of more than 30 μm causes the bulk density not to fall within a specified range, resulting in an increase in variation in chromaticity of any LED made by use of the phosphor. A mass median size of less than 5 μm is not preferable because light-emitting characteristics of the phosphor are deteriorated. The mass median size is here the value obtained by conversion and calculation from the volume median size obtained from the cumulative distribution curve measured by a laser diffraction scattering method according to JIS R1622:1995 and R1629:1997.

The red phosphor may preferably have a span value of 1.6 or less, further preferably 0.1 or more and 1.5 or less. The span value here means the value calculated by (D90-D10)/D50, and the D10 and D90 here mean 10% size and 90% size, respectively, obtained from the cumulative distribution curve on a mass basis, measured in the same manner as in the above mass median size. The span value serves as an index representing the distribution width of the grain size distribution, namely, the variation in size of a grain of the red phosphor. A smaller span value allows the bulk density to more easily fall within a specified range and can reduce the variation in chromaticity of any LED made by use of the phosphor.

The surface state of a powder can be changed depending on a post-treatment method in production. Examples of the post-treatment method of the red phosphor include washing, and covering of the surface of a phosphor grain, and washing is preferable from the viewpoint of enhancements in productivity and bulk density. The washing method is not particularly limited, and the phosphor is preferably washed with an aqueous acidic, alkaline, or polar solution, and may be washed with one aqueous washing solution or may be washed with two or more aqueous washing solutions multiple times.

The red phosphor is represented by general formula: $MSiAlN_3$ (wherein M is at least one or more elements selected from Mg, Ca, Sr and Ba). Examples of M include Mg, Ca, Sr and Ba, and thus the proportion of the mass of M in the composition of the phosphor is high and a preferable range of the bulk density of the red phosphor is varied depending on the type of M. For example, when M is Ca alone, the bulk density may preferably be 0.70 $g/cm^3$ or more and 1.80 g/cm$^3$ or less, and when M corresponds to Ca and Sr, the bulk density may preferably be 1.20 g/cm$^3$ or more and 2.30 g/cm$^3$ or less.

The red phosphor preferably has an angle of repose of 60° or less, more preferably 45° or less. The angle of repose represents the fluidity of the phosphor, and thus serves as an index representing the degree of dispersion of the phosphor used in a LED. An angle of repose of 20° or more and 60° or less can reduce the variation in chromaticity of a LED produced.

Examples of the method for measuring the angle of repose include a method involving measuring the angle created by a powder in free fall of a sample loaded in a container and deposition thereof on a horizontal surface (injection method); a method involving allowing a sample to free fall through a small hole in a container bottom and measuring the angle created by a powder remaining the container (discharge method); and a method involving loading a powder in a container, inclining the container and measuring the angle created by the powder (gradient method). In particular, the injection method is desirably used. Hereinafter, the injection method will be described in detail. A sample is allowed to fall from a funnel at a certain height, onto a horizontal substrate, a basic angle is calculated from the diameter and the height of a conical deposited article produced, and the basic angle is defined as the angle of repose. The angle of repose is preferably repeatedly measured, more preferably measured multiple times and determined as the average value of such measurement values.

Method for Producing Red Phosphor

The method for producing the red phosphor is not particularly limited. A method is here exemplified which involves firing a raw material-mixed powder capable of forming a composition represented by the general formula, in a determined temperature range in a nitrogen atmosphere.

In the production method, any nitride of each constituent element, namely, calcium nitride, strontium nitride, silicon nitride, aluminum nitride or europium nitride is suitably used as a raw material, and any oxide thereof can also be used. For example, an easily available europium oxide may be used as a europium source which serves as a light emission center and thus is added in a very small amount.

The method for mixing the above-mentioned raw materials is not particularly limited, and calcium nitride, strontium nitride, and europium nitride which react violently with moisture and oxygen in the air are suitably handled in a glove box in which the atmosphere is replaced with an inert atmosphere.

The firing container is preferably formed from any material which is stable in a nitrogen atmosphere at a high temperature and which hardly reacts with the raw material-mixed powder and a reaction product thereof, and examples thereof include a container made of boron nitride, a container made of a high melting point metal, and a container made of carbon.

The firing container filled with the raw material-mixed powder is taken out from the glove box and rapidly installed in a firing furnace, and the powder is fired at 1600° C. or more and 2000° C. or less in a nitrogen atmosphere. A too low firing temperature causes an increase in amount of remaining of an unreacted substance, and a too high firing temperature is not preferable because a crystal structure identical to that of a $CaAlSiN_3$ crystal phase is degraded by a host crystal.

The firing time is selected in such a way as to fall within a time range which does not cause any failure, for example, the presence of a large amount of an unreacted substance, insufficient grain growth, or deterioration in productivity, and is preferably 2 hours or more and 24 hours or less.

The pressure of the firing atmosphere is selected depending on the firing temperature. While the red phosphor of the invention can be stably present at the atmospheric pressure at a temperature of up to about 1800° C., a pressurized atmosphere is required at a temperature equal to or more than that temperature in order to suppress degradation of the phosphor. The higher the atmosphere pressure is, the higher the degradation temperature of the phosphor is, and the pressure is preferably less than 1 MPa in consideration of industrial productivity.

The state of a fired product is varied and is in the form of a powdery, clumped, or sintered body depending on compounding of the raw materials and the firing conditions. In the case of use as a phosphor, the fired product is formed into a powder having a determined size, by combining crushing, pulverizing and/or classification operation(s).

A washing step is preferably provided after a pulverizing step in the method for producing the red phosphor. The aqueous solution for use in the washing step is preferably an aqueous acidic, alkaline, or polar solution, as described above. The washing step is a step of dispersing the phosphor after the pulverizing step, in the above-mentioned aqueous solution, and stirring the resultant for several minutes to several hours. The washing step can dissolve and remove any impurity element derived from the firing container, a different phase generated in the firing step, any impurity element included in the raw materials, and any impurity element incorporated in the pulverizing step, and can clean the surface of the phosphor, resulting in an enhancement in bulk density of the resulting phosphor powder.

An acid treatment step for the purpose of removal of impurities, and/or an annealing treatment step for the purpose of an enhancement in crystallinity may be further performed in production of the red phosphor.

The red phosphor can be combined with a semiconductor light-emitting element capable of exciting the phosphor, thereby forming a light-emitting element, and furthermore also providing a light-emitting apparatus including the light-emitting element. A light-emitting element can be obtained in which the red phosphor is irradiated particularly with ultraviolet light or visible light of a wavelength of 350 nm or more and 500 nm or less, from the semiconductor light-emitting element, thereby emitting red light. The red phosphor is combined with a semiconductor light-emitting element such as an ultraviolet LED or a blue LED, and furthermore the combination is, if necessary, combined with other phosphor emitting green to yellow light, and/or a blue phosphor, thereby providing a light-emitting element which easily emits white light.

EXAMPLES

Examples of the invention will be described in detail with reference to Table 1. Table 1 shows the D10, D50, D90, span value, bulk density, and angle of repose of each phosphor of Examples and Comparative Examples.

TABLE 1

| | Element represented by M | Grain size distribution (μm) D10 | D50 | D90 | Span value | Bulk density (g/cm$^3$) | Angle of repose |
|---|---|---|---|---|---|---|---|
| Example 1 | Ca | 10.0 | 16.2 | 26.0 | 0.99 | 1.63 | 27° |
| Example 2 | Ca | 3.2 | 9.2 | 15.7 | 1.36 | 1.01 | 35° |

TABLE 1-continued

| | Element represented by M | Grain size distribution (μm) D10 | D50 | D90 | Span value | Bulk density (g/cm$^3$) | Angle of repose |
|---|---|---|---|---|---|---|---|
| Example 3 | Ca | 9.3 | 18.1 | 33.1 | 1.31 | 0.78 | 31° |
| Example 4 | Ca, Sr | 9.7 | 16.4 | 27.9 | 1.11 | 1.88 | 32° |
| Example 5 | Ca, Sr | 11.2 | 19.3 | 33.0 | 1.13 | 2.06 | 31° |
| Comparative Example 1 | Ca | 9.3 | 18.0 | 32.8 | 1.31 | 0.62 | 48° |
| Comparative Example 2 | Ca, Sr | 19.0 | 43.1 | 84.3 | 1.52 | 2.42 | 39° |

Example 1

An α-silicon nitride powder ($Si_3N_4$, SN-E10 grade manufactured by Ube Industries, Ltd.), a calcium nitride powder ($Ca_3N_2$, manufactured by Materion Corporation), an aluminum nitride powder (AlN, E grade manufactured by Tokuyama Corporation) and europium oxide ($Eu_2O_3$, RU grade manufactured by Shin-Etsu Chemical Co., Ltd.), as raw materials of a phosphor of Example 1, were used at a ratio of Ca:Eu:Al:Si=0.994:0.006:1.00:1.00.

First, $Si_3N_4$, AlN and $Eu_2O_3$ among the raw materials were dry mixed by a V-type mixing machine for 10 minutes. The raw materials after mixing were classified by a nylon sieve having an aperture of 250 μm in order to uniform the sizes of the raw materials after mixing, thereby providing a raw material mixture.

The raw material mixture which passed through the sieve was transferred to a glove box capable of keeping a nitrogen atmosphere having a moisture content of 1 ppm by mass or less and an oxygen content of 1 ppm by mass or less, $Ca_3N_2$ was here compounded into the raw material mixture, and the resultant was dry mixed. The resultant was again classified by a nylon sieve having an aperture of 250 μm in order to uniform the sizes of the raw materials dry mixed. A cylindrical container equipped with a lid and made of boron nitride (N-1 grade manufactured by Denka Company Limited) was filled with 250 g of the raw materials after classification.

The container filled with the raw materials was taken out from the glove box and rapidly installed in an electric furnace of a carbon heater, and the inside of the furnace was sufficiently evacuated to a vacuum of 0.1 Pa or less. Heating was started under evacuation to vacuum, a nitrogen gas was introduced at 650° C., and the atmosphere pressure in the furnace was 0.1 MPa. The temperature was then raised to 1850° C. also after gas introduction, and firing at 1850° C. was performed for 8 hours.

After cooling, a sample recovered from the furnace was a red clumped product, and was crushed in a mortar and finally allowed to fully pass through a sieve having an aperture of 150 μm.

The resulting phosphor sample was subjected to powder X-ray diffraction using CuKα-ray by use of an X-ray diffraction apparatus (UltimaIV manufactured by Rigaku Corporation). The same diffraction pattern as that of a $CaAlSiN_3$ crystal was observed in the resulting X-ray diffraction pattern.

The sample which passed through the sieve was immersed in hydrochloric acid for 1 hour, and washing was performed. After the washing, filtration was performed to separate a phosphor and a treatment liquid. The phosphor was dried in a dryer at 100° C. to 120° C. for 12 hours, the phosphor after drying was classified by a sieve having an aperture of 150 μm, and only the phosphor which passed through the sieve was collected.

Method for Measuring Mass Median Size and Span Value

The mass median size and the pan value were obtained by calculating D10, D50 (mass median size), and D90 from the volume average size measured by a laser diffraction scattering method according to JIS R1622: and R1629 by use of a grain size distribution measurement apparatus (Microtrac MT3000II manufactured by MicrotracBEL Corp.), and determining the span value, (D90-D10)/D50.

Method for Measuring Bulk Density

The bulk density was measured according to the following method. A cylindrical container as a constant-volume container (25 cc) was used for a container for measurement, and the mass thereof was measured by a scale. The container for measurement was equipped with an auxiliary cylinder, a sample was loaded until overflow, such a container for measurement, equipped with an auxiliary cylinder, was tapped fifty times at 50 to 60 times/minute, and the auxiliary cylinder was removed. The sample put over the upper end portion of the container for measurement was leveled off by using a leveling plate. The leveling plate was here used with being inclined backward from the direction of leveling off such that no powder was compressed. The mass of the resultant together with the container for measurement was measured by a scale, the mass of the container for measurement was subtracted therefrom, and the mass of the sample was thus calculated. The measurement was performed three times. The average value with respect to the value obtained by dividing the mass of the sample, as calculated in such each measurement, by the volume of the container for measurement was calculated as the bulk density.

Method for Measuring Angle of Repose

The angle of repose was measured according to the following method. The low angle was calculated from the diameter and the height of a conical deposited product produced by allowing 20 g of a sample to fall onto a substrate from a height of 2 to 4 cm, corresponding to the height of the upper edge of a commercially available glass funnel where the inner diameter of a nozzle was 10 mm, through the funnel at a rate per minute of 20 to 60 g. The measurement was performed three times, and the average value with respect to the low angle was defined as the angle of repose.

Example 2

Each phosphor powder of Example 2 was produced under the same conditions as in Example 1 except that the pulverization and classification conditions were changed such that D10, D50 (mass median size), and D90 were as shown in Table 1. Characteristics of each of the phosphors obtained in Example 2, together with those in Example 1, are shown in Table 1.

Example 3

A phosphor powder of Example 3 was produced under the same conditions as in Example 1 except that the pulverization and classification conditions were changed such that D10, D50 (mass median size), and D90 were as shown in Table 1 and washing with an aqueous ethanol solution was added after the acid washing. Characteristics of the phosphor obtained in Example 3 are also collectively shown in Table 1.

Example 4

An α-silicon nitride powder ($Si_3N_4$, SN-E10 grade manufactured by Ube Industries, Ltd.), strontium nitride ($Sr_2N$, manufactured by Materion Corporation), a calcium nitride powder ($Ca_3N_2$, manufactured by Materion Corporation), an aluminum nitride powder (AlN, E grade, manufactured by Tokuyama Corporation), and europium oxide ($Eu_2O_3$, RU grade manufactured by Shin-Etsu Chemical Co., Ltd.), as raw materials of a phosphor of Example 4, were used at a ratio of Sr:Ca:Eu:Al:Si=0.850:0.130:0.020:1.00:1.00.

Next, $Si_3N_4$, AlN and $Eu_2O_3$ among the raw materials were dry mixed by a V-type mixing machine for 10 minutes. The raw materials after mixing were classified by a nylon sieve having an aperture of 250 μm in order to uniform the sizes of the raw materials after mixing, thereby providing a raw material mixture.

The raw material mixture which passed through the sieve was transferred to a glove box capable of keeping a nitrogen atmosphere having a moisture content of 1 ppm by mass or less and an oxygen content of 1 ppm by mass or less, $Sr_2N$ and $Ca_3N_2$ were here compounded into the raw material mixture, and the resultant was dry mixed. The resultant was again classified by a nylon sieve having an aperture of 250 μm in order to uniform the sizes of the raw materials dry mixed. A cylindrical container equipped with a lid and made of boron nitride (N-1 grade manufactured by Denka Company Limited) was filled with 250 g of the raw materials after classification.

The container filled with the raw materials was taken out from the glove box and rapidly installed in an electric furnace of a carbon heater, and the inside of the furnace was sufficiently evacuated to a vacuum of 0.1 Pa or less. Heating was started with evacuation to vacuum, a nitrogen gas was introduced at 650° C., and the atmosphere pressure in the furnace was 0.9 MPa. The temperature was then raised to 1950° C. also after gas introduction, and firing at 1950° C. was performed for 8 hours.

After cooling, a sample recovered from the furnace was a red clumped product, and was crushed in a mortar and finally allowed to fully pass through a sieve having an aperture of 150 μm.

The resulting phosphor sample was subjected to powder X-ray diffraction using CuKα-ray by use of an X-ray diffraction apparatus (UltimaIV manufactured by Rigaku Corporation). The same diffraction pattern as that of a $(Sr,Ca)AlSiN_3$ crystal was observed in the resulting X-ray diffraction pattern.

The sample which passed through the sieve was immersed in hydrochloric acid for 1 hour, and washing was performed. After the washing, filtration was performed to separate a phosphor and a treatment liquid. The phosphor was dried in a dryer at 100° C. to 120° C. for 12 hours, the phosphor after drying was classified by a sieve having an aperture of 150 μm, and only the phosphor which passed through the sieve was collected.

The resulting phosphor sample was subjected to the same measurement of powder characteristics, as in each of the phosphors obtained in Examples 1 to 3. The results are shown in Table 1.

Example 5

A phosphor powder of Example 5 was produced under the same conditions as in Example 4 except that the pulverization and classification conditions were changed such that D10, D50 (mass median size), and D90 were as shown in Table 1. Characteristics of the phosphor obtained in Example 5, together with those in Examples 1 to 4, are shown in Table 1.

Comparative Example 1

A phosphor powder of Comparative Example 1 was produced under the same conditions as in Example 3 except that no washing with an aqueous ethanol solution was performed after the acid washing. Characteristics of the phosphor obtained in Comparative Example 1, together with those in Examples 1 to 5, are shown in Table 1.

Comparative Example 2

A phosphor powder of Comparative Example 2 was produced under the same conditions as in Example 4 except that the pulverization and classification conditions were changed such that D10, D50 (mass median size), and D90 were as shown in Table 1. Characteristics of the phosphor obtained in Comparative Example 2, together with those in Examples 1 to 5 and Comparative Example 1, are shown in Table 1.

Production of LED

Example 6

A LED was produced by using the red phosphor obtained in Example 1. In other words, 10% by mass of the phosphor grain was added to a silicone resin (trade name: KER6150 manufactured by Shin-Etsu Chemical Co., Ltd.) having thermosetting properties and having fluidity at ordinary temperature, and stirred and mixed to adjust a slurry. Next, 6 mg of the slurry was injected to a top view type package where a blue LED chip having a peak at a wavelength of 450 to 460 nm was mounted, and thereafter the slurry was heated and cured at a temperature of 150° C. for 2 hours. Thus, a LED was produced which included the red phosphor grain of Example 1 and which could absorb light of a wavelength in the range of 420 to 480 nm and emit light of a wavelength in the range of more than 480 nm and 800 nm or less.

Example 7

A LED was produced under the same conditions as in Example 6 except that the red phosphor grain obtained in Example 2 was used.

Example 8

A LED was produced under the same conditions as in Example 6 except that the red phosphor grain obtained in Example 3 was used.

Example 9

A LED was produced under the same conditions as in Example 6 except that the red phosphor grain obtained in Example 4 was used.

Example 10

A LED was produced under the same conditions as in Example 6 except that the red phosphor grain obtained in Example 5 was used.

Comparative Example 3

A LED was produced under the same conditions as in Example 6 except that the red phosphor grain obtained in Comparative Example 1 was used.

Comparative Example 4

A LED was produced under the same conditions as in Example 6 except that the red phosphor grain obtained in Comparative Example 2 was used.

Evaluation of Light-Emitting Characteristics of LED

Fifty LEDs were produced with respect to each of those produced in Examples 6 to 10 and Comparative Examples 3 to 4, and subjected to measurement for chromaticity evaluation by use of a LED measurement apparatus (trade name: CAS140B manufactured by Instrument System). The results were summarized in Table 2 shown below. The chromaticity evaluation here indicated the respective standard deviations ρ of the x value and the y value of the XYZ color system as one of the CIE chromaticity coordinates.

TABLE 2

| | Phosphor used | Standard deviation σ (Chromaticity x) | Standard deviation σ (Chromaticity y) |
|---|---|---|---|
| Example 6 | Example 1 | 0.002 | 0.003 |
| Example 7 | Example 2 | 0.003 | 0.004 |
| Example 8 | Example 3 | 0.006 | 0.007 |
| Example 9 | Example 4 | 0.003 | 0.003 |
| Example 10 | Example 5 | 0.003 | 0.004 |
| Comparative Example 3 | Comparative Example 1 | 0.010 | 0.011 |
| Comparative Example 4 | Comparative Example 2 | 0.013 | 0.014 |

It was found from the results of Examples and Comparative Examples, shown in Table 2, that the bulk density of the red phosphor was controlled in the specified range to thereby allow a LED using the phosphor to be reduced in variation in chromaticity.

INDUSTRIAL APPLICABILITY

The red phosphor of the invention is excited by blue light to thereby exhibit red light emission, and a LED smaller in variation in chromaticity than conventional one is obtained. That is, the red phosphor of the invention can be suitably used as one white phosphor for LED, which is formed by combining the phosphor with a light-emitting element using the phosphor, for example, a semiconductor light-emitting element capable of exciting for emission of blue light, and the light-emitting element can be suitably used for a light-emitting apparatus such as an illumination instrument or an image display apparatus.

The invention claimed is:

1. A red phosphor represented by general formula: $MSiAlN_3$, wherein M is at least one or more elements selected from Mg, Ca, Sr and Ba, wherein the phosphor comprises M partially replaced with Eu and having, as a host crystal, a crystal structure identical to that of a $CaAlSiN_3$ crystal phase, wherein the phosphor has a bulk density of 0.70 $g/cm^3$ or more and 2.30 $g/cm^3$ or less and an angle of repose of 20° or more.

2. The red phosphor according to claim 1, having an angle of repose of 60° or less.

3. The red phosphor according to claim 1, wherein M is Ca, and the phosphor has a bulk density of 0.70 $g/cm^3$ or more and 1.80 $g/cm^3$ or less.

4. The red phosphor according to claim 1, wherein M is Ca or Sr, and the phosphor has a bulk density of 1.20 $g/cm^3$ or more and 2.30 $g/cm^3$ or less.

5. The red phosphor according to claim 1, having an angle of repose of 27° or more.

6. The red phosphor according to claim 1, having an angle of repose of 45° or less.

7. A light-emitting element comprising the red phosphor according to claim 1, and a semiconductor light-emitting element capable of exciting the red phosphor.

8. A light-emitting apparatus comprising the light-emitting element according to claim 7.

* * * * *